United States Patent [19]

Muka et al.

[11] Patent Number: 4,486,652

[45] Date of Patent: Dec. 4, 1984

[54] BLACKBODY RADIATION SOURCE WITH CONSTANT PLANAR ENERGY FLUX

[75] Inventors: Richard S. Muka, Topsfield; Carl J. Russo, Ipswitch, both of Mass.

[73] Assignee: Varian Associates, Inc., Palo Alto, Calif.

[21] Appl. No.: 481,205

[22] Filed: May 10, 1983

Related U.S. Application Data

[62] Division of Ser. No. 262,838, May 12, 1981, Pat. No. 4,417,347.

[51] Int. Cl.$^3$ ............................................. H05B 3/10
[52] U.S. Cl. .................................. 219/553; 219/354; 219/411; 219/343; 250/493.1; 338/293; 338/217; 373/134
[58] Field of Search ............... 219/385, 347, 353, 354, 219/343, 411, 502, 552, 553; 165/186; 148/1.5; 373/158, 134; 414/217; 214/17 B; 250/352, 354.1, 493.1, 504 R; 252/502; 338/242, 217, 316, 293

[56] References Cited

U.S. PATENT DOCUMENTS

| | | | |
|---|---|---|---|
| 2,667,806 | 2/1954 | Gier et al. | 219/540 X |
| 2,952,762 | 9/1960 | Williams et al. | 250/354.1 X |
| 3,138,697 | 6/1964 | Baulsa | 219/353 |
| 3,205,343 | 9/1965 | De Bell et al. | 250/504 |
| 3,263,016 | 7/1966 | Branstetter et al. | 173/158 |
| 3,487,216 | 12/1969 | Webb | 250/352 |
| 3,487,217 | 12/1969 | Cussen | 219/354 X |
| 3,573,429 | 4/1971 | Brodbeck et al. | 219/343 |
| 3,954,191 | 5/1976 | Wittkower et al. | 414/217 |
| 4,220,846 | 9/1980 | Rice et al. | 219/375 X |
| 4,311,427 | 1/1982 | Coad et al. | 414/217 |
| 4,350,537 | 9/1982 | Young et al. | 148/1.5 |

OTHER PUBLICATIONS

P. D. Scovell and J. M. Young, "Low Temperature Thermal Annealing of Arsenic Implanted Silicon", *Electronics Letters*, Jul. 31, 1980. vol. 16, p. 614.
P. D. Scovell, "Pulsed Thermal Annealing of Arsenic-Implanted Silicon", *Electronics Letters*, Jun. 11, 1981.
C. Hill, "Beam Processing in Silicon Device Technology", *Laser and Electron Beam Solid Interactions and Materials Processing*, V 361, Elsevier (1981).
S. Lau et al., "Solar Furnace Annealing of Amorphous Si Layers", *Applied Physics Letters*, V 35, No. 4, Aug. 15, 1979, p. 237.
Bor-Yeu Tsaur et al., "Transmission Electron Microscopy and Ion-Channing Studies of Hetero-Epitaxial $Ge_{1-x}Si_x$ Films Produced by Transient Heating", *Applied Physics Letters*, V 38, No. 6, Mar. 15, 1981, p. 447.
U. Konig et al., "MBE: Growth and Sb Doping", *J. Vac. Sci. and Tech.*, V 16, No. 4, Jul. 1979, p. 985.
A. Lietoila et al., "The Solid Solubility and Thermal Behavior of Metastable Concentrations of As in Si", Applied Physics Letters, V 36, No. 9, May 1, 1980, p. 765.
T. O. Yep et al., "Scanned Electron Beam Annealing of Boron-Implanted Diode", *Applied Physics Letters*, V 38, No. 3, Feb. 1, 1981, p. 162.

*Primary Examiner*—Volodymyr Y. Mayewsky
*Attorney, Agent, or Firm*—Stanley Z. Cole; William R. McClellan

[57] ABSTRACT

A processor apparatus is provided in which a blackbody radiator having a constant planar energy flux characteristic is placed in opposition to semiconductor material. The blackbody source produces a constant planar energy flux to uniformly heat the material. The source is heated to a sufficiently high temperature for a sufficient time to anneal or activate a semiconductor wafer or to epitaxially regrow a thin epitaxial film. The processor is operated by accomplishing the steps of presenting a blackbody radiator in opposition to semiconductor material to be thermally treated, radiatively heating the material to a sufficiently high temperature for a sufficient time to accomplish the desired process result, and cooling and removing the material. In the interval between presentation of successive samples of the material to the source, the source may be shuttered or idled to reduce energy consumption.

2 Claims, 11 Drawing Figures

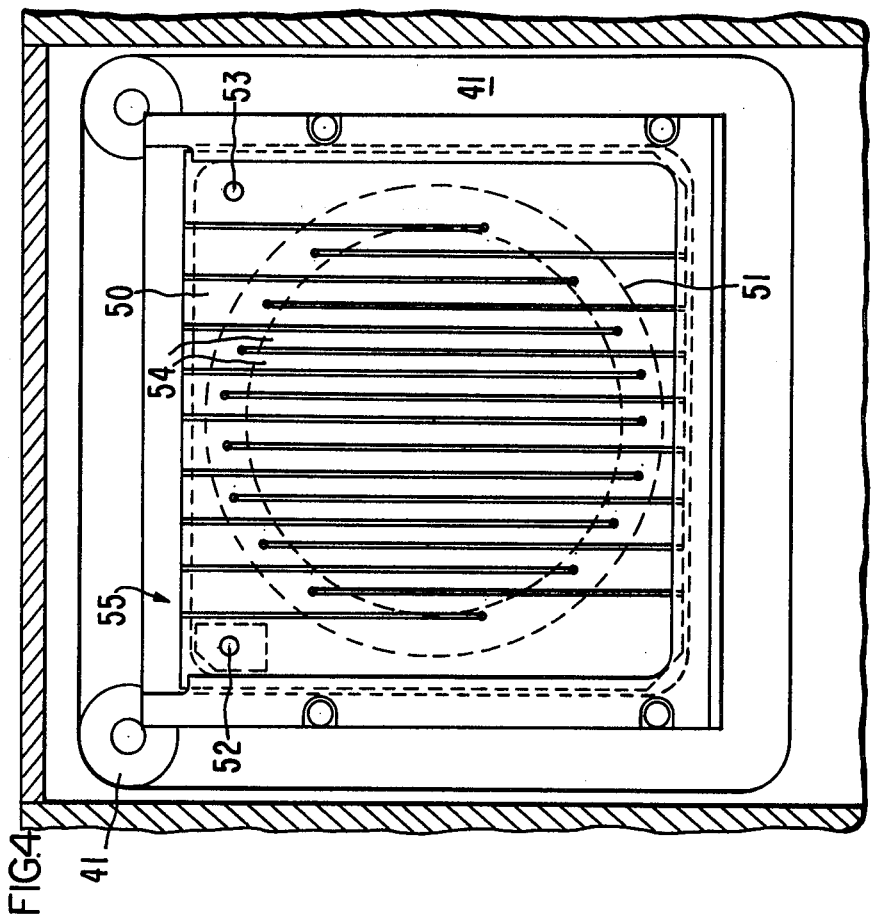
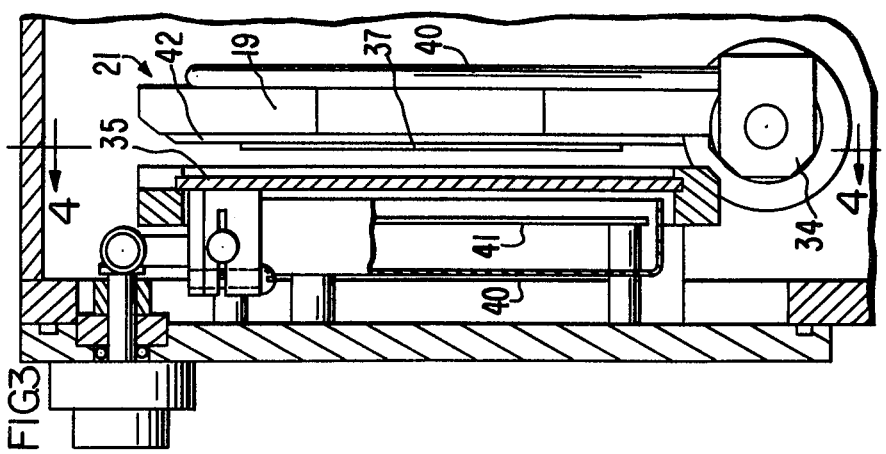

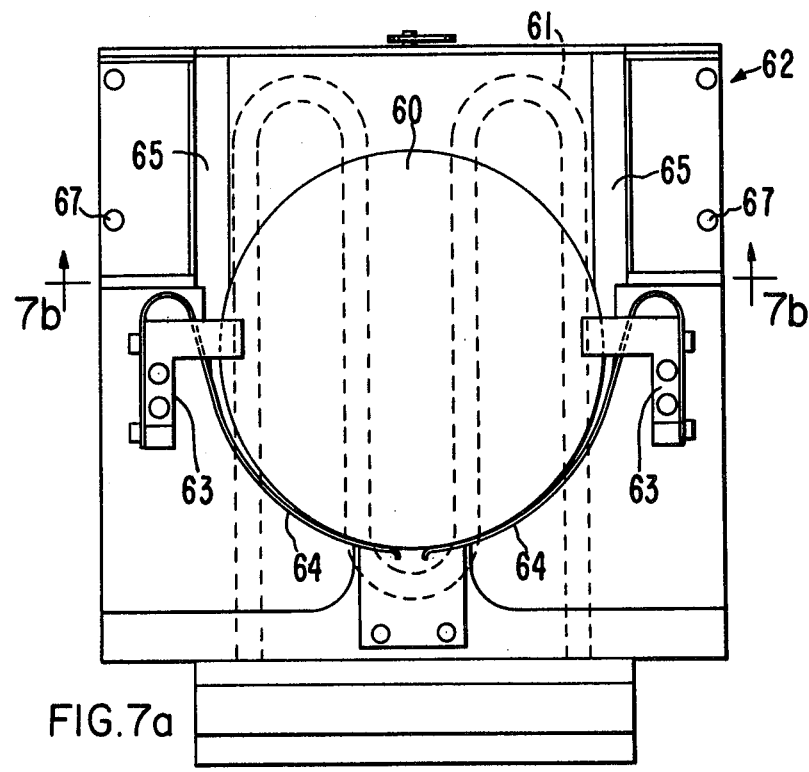
FIG.7a
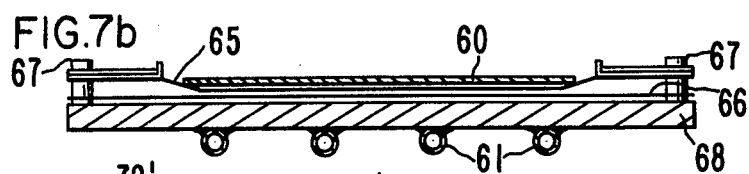
FIG.7b
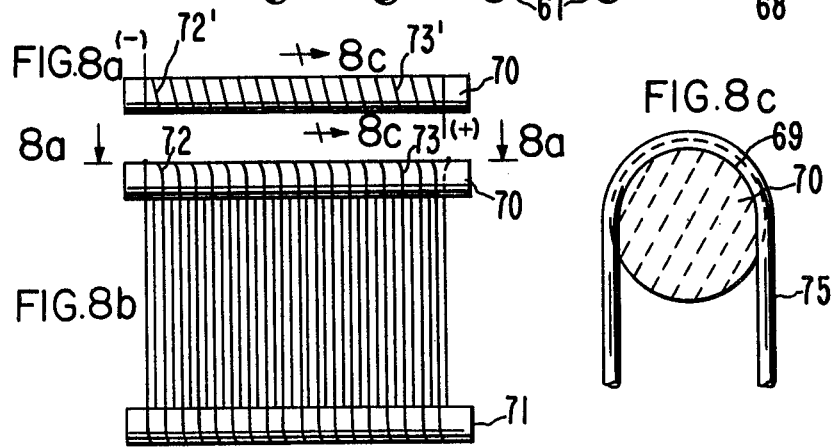
FIG.8a
FIG.8b
FIG.8c

BLACKBODY RADIATION SOURCE WITH CONSTANT PLANAR ENERGY FLUX

This application is a continuation, of application Ser. No. 262,838, filed May 12, 1981, now U.S. Pat. No. 4,417,347.

This invention relates to a blackbody radiation source with a constant planar energy flux for annealing crystal structure and activating dopants in semiconductor materials, increasing grain size in polycrystalline semiconductor materials or otherwise thermally processing semiconductor materials.

In the semiconductor industry, wafers of a single crystal semiconductor material, typically silicon, are processed to produce both discrete devices and integrated circuits. In the course of processing, the crystalline lattice of the semiconductor material may be damaged. For example, during ion implantation the incident energetic ions will break covalent bonds between silicon atoms in the crystalline lattice. It is thus desired to eliminate the defects in the crystalline lattice by annealing at a sufficiently high temperature for a sufficiently long time.

The thermal treatment that produces annealing of crystal damage also serves to activate the dopant species in the silicon, i.e., the dopant atoms such as boron, phosphorous or arsenic assume substitutional or near-substitutional positions in the crystalline lattice so they may serve as sources of charge carriers. See, e.g., A. Lietoila, et al, "Metastable As-Concentrations in Si Achieved by Ion Implantation and Rapid Thermal Annealing", J. App. Phys., v. 52, p. 230 (1981).

In the production of thin films of semiconductor materials it is desirable to increase the grain size of polycrystalline material or to convert amorphous silicon into an epitaxial silicon layer. The application of thermal energy in an appropriate manner may be used to accomplish these objectives. See, e.g., J. C. C. Fan, et al, "Lateral Epitaxy by Seeded Solidification for Growth of Single-Crystal Si Films on Insulators", App. Phys. Lett., v. 38, p. 365 (1981).

The conventional technique for thermally treating semiconductor materials is furnace annealing. In this technique, for example, silicon wafers are taken in a batch of 100 to 200 wafers and placed in a carrier (boat). The boat is slowly inserted into a quartz tube mounted within a cylindrical cavity and surrounded by resistance heating elements. The tube is typically continuously purged from the inside towards the outside by an inert gas. The cavity and quartz tube will typically have temperature zones which become progressively hotter. By this process the average temperature experienced by the wafers gradually increases to about 1000° C. The boat is then retained in the furnace at temperatures of about 900° to 1100° C. for times on the order of one-half hour. Annealing under such conditions is generally satisfactory, especially for lower dose implants on the order of $10^{10}$–$10^{14}$/cm$^2$; activation is virtually always satisfactory for such implants. However, uniformity of dopant distribution is often not obtained since the time and temperature characteristics of a given wafer are not identical to those of other wafers in the batch; also, at a selected location on a given wafer the temperatures experienced over time may vary. This distribution non-uniformity is undesirable in the fabrication of complex integrated circuits since yields are lowered. Also, the annealing of wafers at such temperatures for significant lengths of time produces undesirable spreading or redistribution of the dopant both laterally and vertically. This is especially undesirable for high dose implants on the order of $10^{15}$–$2 \cdot 10^{16}$ per cm$^2$ such as are used in fabricating high density MOS devices. Spreading also makes shallow junction and/or VLSI devices difficult if not impossible. In addition, at high doses activation becomes difficult with furnace annealing because the dopant atoms cluster together and do not individually become electrically active. See, e.g., M. Y. Tsai, et al, "Shallow Junctions by High-Dose As Implants in Si: Experiments and Modelling", J. App. Phys., v. 51, p. 3230 (1980). Generally, it is desirable to obtain annealing and activation with minimal dopant redistribution. Also, it is desirable to obtain as high an activation as possible in order to use as low an implantation dose as possible; for otherwise equivalent conditions the lower implantation dose the higher the throughput. Also, conventional furnace annealing is time consuming and is not particularly energy efficient, an important consideration for developing cost effective film formation for photovoltaics.

Two techniques have been widely proposed for producing the fast thermal treatment of semiconductor materials. In both cases, the surface of the material is exposed to an energy beam to raise the temperature of the material, and produce the desired result, e.g., annealing, activation, increased grain size, epitaxial regrowth or the like. Laser beams and electron beams have been proposed and tried experimentally. With both, for example, it has been found that fast annealing, on the order of microseconds, is possible. See e.g., W. L. Brown, Superfast Annealing, IEEE Spectrum, April 1981, p. 50 et. seq. and references cited therein. These techniques are under study in many laboratories although they have not yet been incorporated widely in commercial products. Laser beams are highly energy inefficient and require mechanical, electro-optical or electro-mechanical scanning. Laser beams may also experience interference effects when a $SiO_x$ pattern lies on a silicon substrate. In addition, the interface may be preferentially heated thereby causing the oxide layer to come off. Electron beams are relatively energy efficient but produce neutral traps near insulator-semiconductor junctions which can result in charging effects in operating devices over time. A third approach which has been suggested is the use of flash lamps or arc lamps with a suitable reflector to thermally treat semiconductor materials. For semiconductor wafers, this later approach has the advantage that it heats the whole wafer at the same time and eliminates thermal non-uniformities by producing a planar isotropic thermal front. Its disadvantages are that the process is not energy efficient and may require complex optical elements. The optical system also must be able to eliminate scattered light or in some way use it constructively. See, K. Nishiyama, "Radiation Annealing of Boron-Implanted Silicon With a Halogen Lamp", Japanese Journal of Applied Physics, v. 19, October 1980, P. L563.

It is an object of the present invention to provide a blackbody radiative source producing a constant planar energy flux.

It is another object of the present invention to increase grain size in polycrystalline semiconductor material by a blackbody source which produces a constant planar energy flux.

It is still another object of the present invention to regrow an epitaxial semiconductor layer from amorphous material by applying blackbody radiation with a constant planar energy flux characteristic.

It is a further object of the present invention to provide for annealing a semiconductor wafer by a blackbody radiation source which produces a constant planar energy flux.

It is yet another object of the present invention to provide for annealing a semiconductor wafer and obtaining a high activation of dopant species therein by means of a blackbody radiation source producing a constant planar energy flux which is placed in close opposition to the wafer.

BRIEF DESCRIPTION OF THE DRAWINGS

For a more complete understanding of the present invention, reference may be had to the accompanying drawings which are incorporated herein by reference and in which:

FIG. 3 is an edge view of a platen for holding a semiconductor wafer in the processor apparatus of FIGS. 1 and 2;

FIG. 4 is a frontal view of a blackbody radiator which produces a constant planar energy flux for incorporation in the processor apparatus of FIGS. 1 and 2;

FIGS. 7a and 7b are, respectively, a plan and a side view, of an alternate embodiment of a platen for use in the processor of the present invention; and FIGS. 8a-8b are plan and side views, respectively, of an alternate blackbody radiator which produces a constant planar energy flux.

SUMMARY OF THE INVENTION

Figure 1:
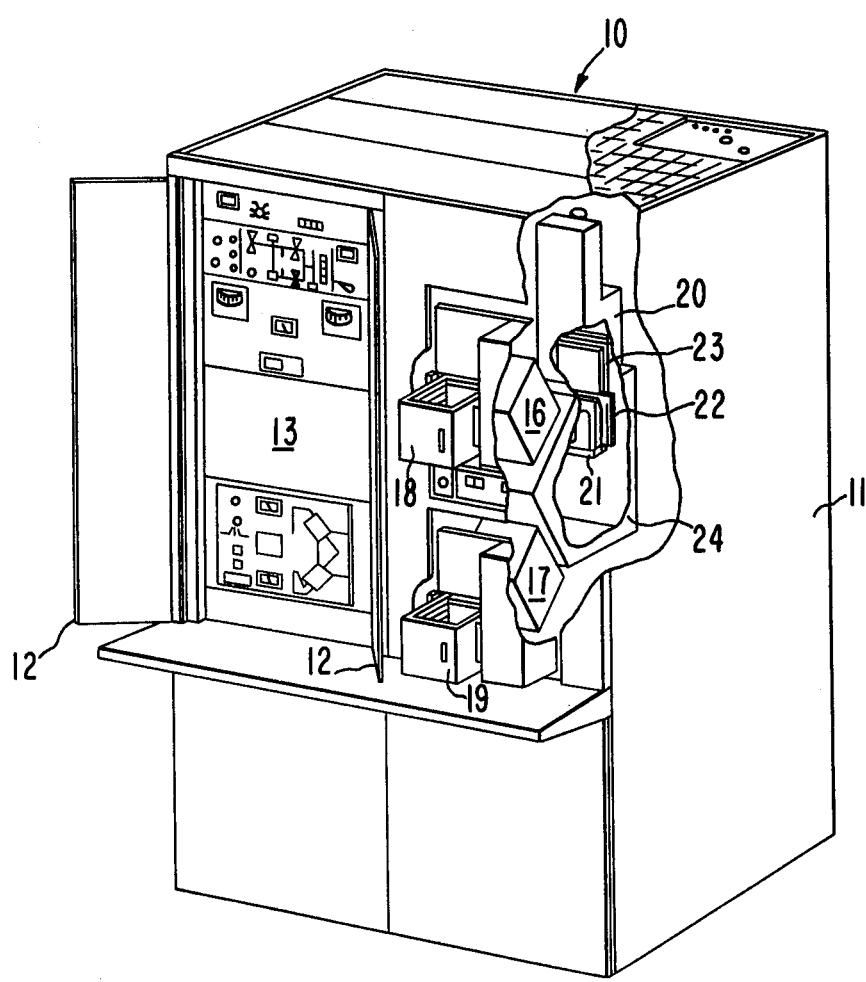
FIG. 1 is a perspective, partially broken away view of processor apparatus in accordance with the present invention.

A processor apparatus is provided in which a blackbody radiator having a constant planar energy flux characteristic is placed in opposition to semiconductor material. The blackbody source produces a constant planar energy flux to uniformly heat the material. The source is heated to a sufficiently high temperature for a sufficient time to thermally treat the material, e.g., to anneal or activate a semiconductor wafer or to epitaxially regrow a thin epitaxial film.

The process of the present invention comprises the steps of presenting a blackbody radiator in opposition to semiconductor material to be thermally treated, radiatively heating the material to a sufficiently high temperature for a sufficient time to accomplish the desired process result. In the interval between presentation of successive samples of the material to the source, the source may be shuttered or idled to reduce energy consumption.

DESCRIPTION OF THE PREFERRED EMBODIMENTS

The ensuing description will cover in detail the application of the apparatus of the present invention to the annealing and activation of semiconductor wafers. This is the more significant commercial application of the processor at present. However, the treatment of polycrystalline semiconductor materials to increase grain size, the epitaxial regrowth of an amorphous layer and like applications may be carried out by the apparatus of the present invention. The advantages of rapid isothermal anneal are throughput, minimal adverse side effects such as redistribution or damage to temperature sensitive layers, uniform treatment, and the possibility that oxide cap layers may not be needed for implanted dopants with high vapor pressures. These advantages apply generally to semiconductor materials. Throughout this specification the term blackbody radiator is used to describe the thermal source used in the processor. This term is intended to be broad enough to cover the concept of a grey body, a radiator whose spectral emissivity is less than one but at least a portion of whose emissivity as a function of wavelength is proportional to that of a blackbody.

Furnace annealers typically utilize resistive heaters surrounding a quartz tube containing the silicon wafers. The quartz tube is continuously purged by an oxidizing ambient such as moist air or an inert gas such as nitrogen. Heating is convective, conductive and radiative. There are thermal gradients from wafer-to-wafer and across individual wafers. While thermal shock to the wafers is reduced by slow insertion of the quartz tube into the furnace, by temperature gradients built into the furnace or by cycling of furnace temperature, there is a tendency for wafers to bow or warp. Furnace annealers require power supplies as large as 20 kilowatts and are expensive to operate.

With furnace annealing, dopant redistribution is not readily controlled since the long anneal time allows lateral and vertical distribution to occur to significant distances in the material on the order of 0.5 $\mu$m. Such gratuitous distribution is not acceptable when design ground rules approach 1 $\mu$m. Also, activation is not complete so that at high dose levels, e.g., about $10^{15}$–$2 \times 10^{16}$ per centimeter squared, exceedingly large doses must be used since as much as $\frac{1}{2}$ of the dopant atoms do not take substitutional positions in the lattice. And some of the activation may be metastable so that it does not persist over the life of the product. The problems of redistribution and incomplete activation become increasingly important as device size decreases and as shallow junction devices having junction depths on the order of 0.2 $\mu$m are fabricated.

The conventional wisdom has been that in order to avoid the problems associated with conventional furnace annealing exceedingly fast annealing was required. Thus, laser, electron beam and flash lamp annealing have been touted as allowing very fast annealing on the order of microseconds or less. Such superfast annealing has the disadvantage that the protective oxide layer over the semiconductor may peel or pop off. An annealing technique with annealing time midway between furnace annealing and subsecond annealing is most desirable because satisfactory throughput can be achieved with single wafer handling and satisfactory activation.

Figure 2:
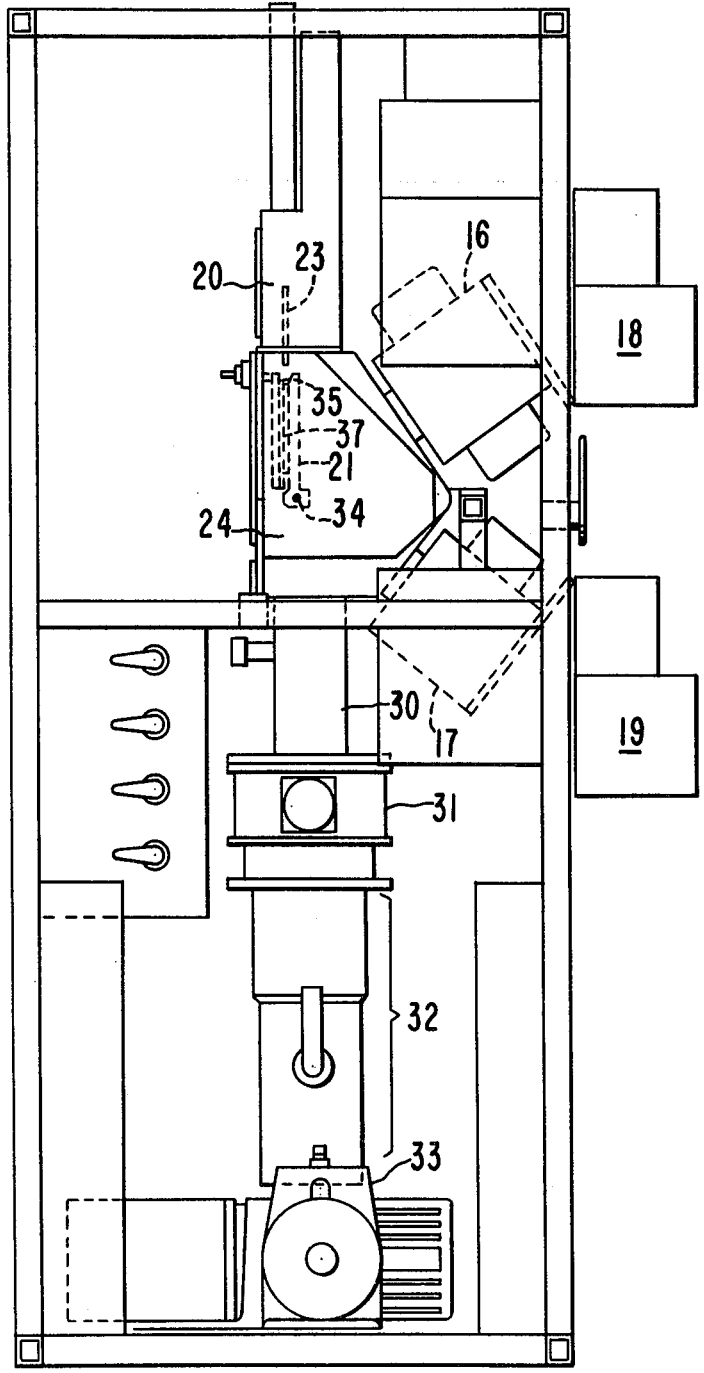
FIG. 2 is a side view of the apparatus of FIG. 1.

The apparatus of the present invention is illustrated by the processor of FIGS. 1-2. The processor is configured as a wafer annealer for receiving, annealing and discharging semiconductor wafers. Wafer annealing apparatus 10 is shown in FIG. 1 in partially brokenaway perspective view. Electronic control panels 13 are included within housing 11 and are accessible through doors 12. The apparatus utilizes a Wayflow ® gravity in, gravity out end station, as described in A. B. Wittkower, U.S. Pat. No. 3,901,183, for insertion and removal of silicon wafers. Other embodiments may employ other wafer handling techniques such as air track or the cassette-to-cassette system disclosed in copending application of G. L. Coad, "Wafer Transfer System", U.S. Pat. No. 4,311,427, issued Jan. 19, 1982. In the Wayflow ® end station a wafer is inserted from a cassette placed in cassette holder 18 through entrance lock 16 (see A. B. Wittkower, et al, U.S. Pat. No. 3,954,191) into vacuum chamber 24, 20. The wafer slides by gravity feed onto a platen 21, which is then oriented in an appropriate receiving position. After insertion of the wafer, platen 21 is rotated on axis 34 to an annealing position in opposition to blackbody source 22. Blackbody source 22 may be shuttered by shutter plate 23 until the platen brings the wafer in opposition, source 22 may be on but idled until the wafer is in place or some other transitional variation may be employed. The distance between the wafer and blackbody source 22 may vary from about one-quarter inch to as far as practicable. The actual distance is determined by uniformity requirements and the space taken up by shutter, shields and platen. For uniformity, the active area of the source is preferably at least as large as the wafer since the viewing factor from source to wafer must be as high and uniform as possible. See M. Jakob, et al., *Elements of Heat Transfer,* Chp. XI-7 (1957). The temperature of the blackbody source will typically be 1400° C. to anneal and activate a silicon wafer. The anneal time will vary from about a second to about ten seconds. Heating is radiative so that the wafer increases in temperature until at equilibrium it is nearly at the temperature of the thermal source. In practicable systems with cycle times of one to ten seconds, however, the wafer will not reach equilibrium as annealing and activation is accomplished before the wafer reaches, e.g., 900° C. After the annealing and activation is accomplished the wafer is removed through exit lock 17 into a cassette in cassette holder 19.

To promote uniform heating, it is desired to heat by radiation and not by convection. With conventional furnace annealing heating is accomplished in large part by convection of the nitrogen, argon, or other gaseous ambient; such heating is not uniform due to thermally induced gas currents. In the process or apparatus of the present invention, control is maintained over the pressure at least between the blackbody source source and the semiconductor material. The pressure in this region will vary from $10^{-7}$ Torr to ambient and is selected so that the mean free path of the gas is much greater than the source-to-wafer distance. Significant conduction heating is thereby eliminated. As seen in FIG. 2 a mechanical roughing pump 33 is used in series with a diffusion pump 32 to evacuate chamber 24 through tube 30 and baffle 31. Thus, the pressure in work chamber 24, 20 is controlled at the desired level, with the criterion being, as stated above, that the mean free path of the gas molecules should be much larger than the distance between blackbody source 35 and the wafer 37. Consequently, radiative heating by thermal source 35 predominates. The efficiencies of this approach are high, even after vacuum equipment costs are considered, because only the wafer and not the walls of the chamber are heated.

The wafer 37 is heated by a constant planar energy flux produced by blackbody radiation source 35. The term constant planar energy flux means that across a planar front a constant energy flux is produced by this source. The power may vary due to ramping of the source but the energy flux across the planar front will remain constant. The planar isotherm uniformly heats the wafer 37. This occurs in part because blackbody radiation is primarily in the infrared and silicon is partially transparent to infrared. Thus, the radiation penetrates a several hundred micron thick wafer in milliseconds and heats it uniformly. When the surface temperature of the wafer is 900° C. the gradient through the wafer is less than 50° C. In addition, the radiation may be reflected from the platen and pass back through the wafer with additional absorption or may radiate back to the source and enhance source efficiency. As the temperature of silicon increases, the bandgap narrows and the portion of the blackbody spectrum below the bandgap increases to enhance absorption. Also, in heavily doped semiconductors the absorption is increased due to the doping and to the damage in the crystal structure. See Victor I. Fistul', *Heavily Doped Semiconductors,* Plenum (1969), Chp. 4; Jacques I. Pankove, *Optical Processes in Semiconductors,* Prentice Hall (1971) Chp. 3. As seen in FIG. 3, wafer 37 is positioned in close opposition to blackbody source 35, on the order of an inch and preferably less than one-half inch. Thus, since radiative heating predominates, the temperature uniformity of the wafer 37 will essentially equilibrate to that of the emitting surface of blackbody source 35, although in practice equilibrium is often not reached. As a consequence of heating with no temperature gradient across the plane of the wafer, the likelihood of bowing, warping or cracking of the wafer is reduced.

The wafer 37 is heated from a temperature on the order of 30° C. to a temperature on the order of 900° C. in a number of seconds, typically from one to ten seconds. The thermal input to the wafer, i.e., the integral of energy flux over time, depends on the wafer mass, material type, dopant concentration and processing history of the wafer. When thermal treatment is complete the thermal source is either shuttered by means of mechanical shutter 23 shown in FIG. 1, is idled or is shut off. If the wafer is silicon it is preferably then cooled down to 700° C., the approximate limit of incandescence (about 650°–700° C.), or less so that it may be removed from the annealing chamber. This is accomplished by actively cooling the platen or by rotating the platen so the wafer radiates to the walls of the chamber which appear as a blackbody sink. As shown in FIG. 3 the platen 21 is comprised of a metal block 19 having coiled cooling tubes 40 affixed to the back thereof. The cooling tubes 40 contain chilled water (10°–15° C. at one gallon per minute) or other coolant and are connected by feedthroughs (not shown) to a source external to the annealing chamber. On the front side of the platen to foster uniform annealing a circumferential strip 42 made from a refractory metal is provided. This strip may be heated to ensure a uniform temperature profile between the edges of the wafer and the center. Planar shields 40 and 41 are also positioned between thermal source 35 and the walls of the vacuum chamber. These shields reduce the thermal losses in accordance with the formula $1/n+1$ where n is the number of shields in succession, providing there is a vacuum separation between each shield. In a preferred embodiment the platen is provided with internal shields. As shown in FIG. 7*b* a pair of shields 65 and 66 are interposed on on spacers 67 between wafer 60 and platen body 68. These shields are fabricated from a refractory metal such as Ta or Mo. In the preferred embodiment shown shield 65 has a concave-like shape so that wafer 60 slides over it, making contact only at the peripheries of the shield. This protects the device side of the wafer if the back side is annealed and introduces an additional thermal barrier since heat conduction is minimized. In this preferred platen 62 refractory metal leaf springs 64 are attached to holders 63 as a stop for wafer 60.

One embodiment of the blackbody radiator 35 is shown in detail in FIG. 4. To obtain uniform heating over the area of the wafer, in accordance with the present, the blackbody source describes a uniform thermal map over its surface. This uniform thermal map produces a planar thermal front, i.e., on parallel planes in front of the source the same temperature is experienced. Thus, since heating of the wafer is radiative the radiation heats the wafer with two dimensional isotropy. To produce the isotherms a planar source is preferably although not necessarily used. In theory, as described subsequently, a non-planar source can produce isotherms.

The preferred blackbody source is a resistive material which can be molded or cut into a planar shape containing a pattern of strips. The most preferred source is graphite, one example of which is Stackpole 2020 which is available in sheet form and can be cut into the serpentine pattern shown in FIG. 4. Alternately, high purity pyrolitic graphite may be used. A sheet 50 of graphite about one-sixteenth to one-eighth inch thick is configured to produce the serpentine pattern consisting of strips 54. The corners of blackbody source 55 are mounted on a metal frame 41 on opposing corners thereof by means of conductive contact studs 52 and 53. In a preferred embodiment the carbon sheet is counterbored before the strips are cut out in order to reduce the sheet thickness within the circumference 51. As a consequence, the temperature is highest in the circular zone within circumference 51, the zone that is placed in opposition to a wafer held in a platen. Typically, such a planar serpentine strip source will use a power supply of about 5 kilowatts, although the more efficient the shielding the lower the required power input. For the most uniform heating the effective area of the blackbody source must be at least as large as the wafer being heated and the wafer should be as close to the source as practicable. In another alternate embodiment a sheet of refractory metal, on the order of 5 thousands inch thick, is stretched between two pairs of bar clamps. Such a sheet source has a lower emissivity than the preferred carbon and is subject to high in-rush currents since the resistivity variations with temperature are much higher than with carbon.

A non-planar source which produces constant planar energy flux is shown in FIGS. 8a-8c. Two cylindrical rods 70 and 71 are separated a fixed distance apart within a suitable frame (not shown). A filament wire of a refractory metal, e.g., 0.040" Ta, is wound around the rods to weave the pattern shown fully in FIG. 8b. The segments between the rods are generally perpendicular to the rods with the displacement along the length of the rods occurring as the filament wraps around each rod as shown in FIG. 8a. The displacement of the segments is uniform so the underlying segments lie in the middle of the two adjacent overlying segments as seen in the plan view of FIG. 8b. Thus, by comparing FIGS. 8a and 8b the identity of segment 72' with segment 72 and of segment 73' with segment 73 can be seen. The thermal effect in the front of the source is to approximate a planar source and a constant planar energy flux is produced. In a preferred embodiment the rods are grooved as shown in FIG. 8c to permit the filament 75 to nest in groove 69 in rod 70 as it wraps around from the upper side to the lower side or vice versa.

Figure 6:
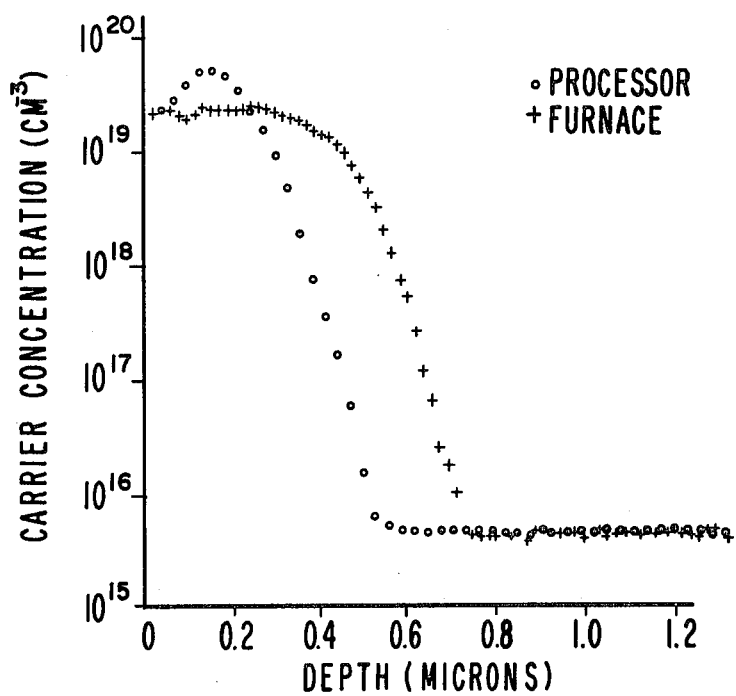
FIG. 6 is a composite chart showing dopant redistribution for an annealing treatment in a conventional furnace annealer and in the processor of the present invention.

In annealing wafers in accordance with the process of the present invention it has been found that dopant redistribution has been significantly reduced. FIG. 6 compares dopant redistribution of boron implanted silicon for a furnace annealer (+ marks) with annealing of boron implanted silicon in the processor of the present invention (0 marks). The furnace annealed wafer experienced a dose of $9.6 \times 10^{14}/cm^2$ boron 11 implanted at 50 kev. The wafer was furnace annealed for 1000° C. at 30 minutes. The wafer treated in the processor of the present invention experienced a dose of $1 \times 10^{15}/cm^2$ boron 11 implanted at 50 kev. The processor was operated at 4.5 kw for 10 seconds with the backside of the wafer being exposed to the blackbody source of FIG. 4. The maximum distribution of the boron in the furnace annealed silicon was about 0.72 $\mu m$; the maximum distribution of the boron treated in the processor of the present invention was about 0.55 $\mu m$. In addition, the peak distribution of boron in the silicon treated in the processor of the present invention was higher, a logical result since the original dosages were comparable.

Figure 5:
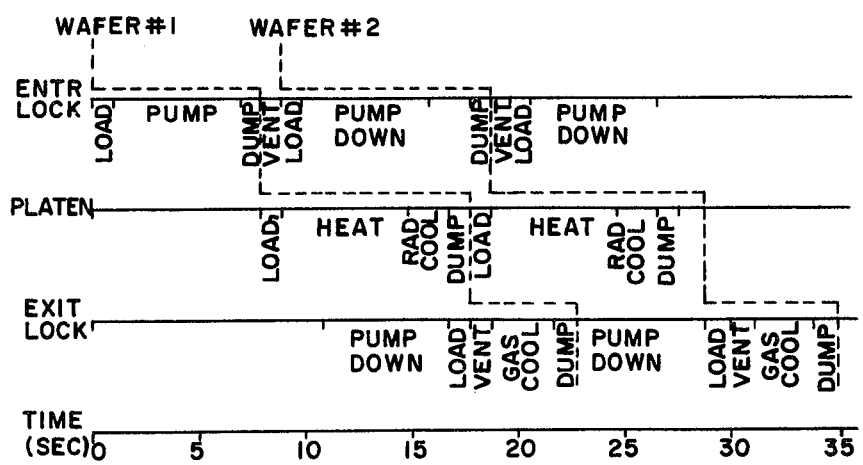
FIG. 5 is a time line chart of the operation of the processor of FIGS. 1-2 as a semiconductor wafer annealer.

The process of the present invention can be seen by tracing a wafer through the component time line chart of FIG. 5. Wafer #1 is placed in the entry lock in the load step. The entry lock is pumped down to a vacuum of about 0.1 Torr. After about 1 second the lock opens to the treatment chamber and the wafer is then placed on the platen in the treatment chamber. Once the treatment chamber is sealed and the platen is in position opposite to the blackbody source a constant planar thermal flux is applied for a time between about one second and about ten seconds. When the maximum temperature is reached the blackbody radiator is idled or shuttered and the platen rotated to a position at which the now-hot wafer can cool for about two seconds by radiating energy to the walls of the chamber. Alternatively, the blackbody radiator may be programmed by microprocessor control to go through any temperature cycle desired. The wafer is then loaded into the exit lock where the wafer is cooled by gas conduction and convection during exit lock venting. The wafer is then transferred from the exit lock to the outside. A second wafer trails behind wafer 1 and other wafers are processed in succession. With the process of the present invention a high throughput, on the order of 150 to 250 wafers per hour is possible, with only several wafers being at risk at any point in time.

In practicing the process of the present invention, it is desirable to avoid contamination of the active surface of the wafer. This surface is especially vulnerable to contamination from Na+ and heavy metals. Thus, only pure heat treated, carbon or metal foil thermal sources may be used. Graphite sources must be thoroughly cleaned, e.g., by vacuum firing since C-V shifts indicate that metallic contaminants may be present without such firing. One variation in the practice of the process which avoids contamination is to slide the wafer into the platen with the backside exposed. Thus, any contamination from the source would fall upon the backside of the wafer far away from the active regions on the front side and would not interfere with device operation. Due to the planar constant energy flux heating described previously, the top side of the wafer will itself heat uniformly and shortly in time (miliseconds) after the exposed backside experiences the planar isotropic thermal front. The whole thickness of the wafer also heats uniformly.

We claim:

1. A device for heat treatment of a semiconductor wafer comprising:

a blackbody radiation source made from a sheet of electrically resistive material configured in a generally planar, serpentine pattern and adapted for parallel, closely spaced alignment with said wafer, said source including means for conserving energy by establishing a prescribed radiation intensity over a region not substantially larger than said wafer and for providing substantially uniform blackbody radiation intensity within said region over the surface of said wafer, said means including a thinned central portion of said resistive sheet which produces higher radiation intensity than the peripheral portion; and electrical means for connecting said blackbody radiation source to a source of electrical energy.

2. The device as defined in claim 1 wherein said resistive material is graphite.

* * * * *